United States Patent
Widmer

(10) Patent No.: US 6,496,540 B1
(45) Date of Patent: Dec. 17, 2002

(54) TRANSFORMATION OF PARALLEL INTERFACE INTO CODED FORMAT WITH PRESERVATION OF BAUD-RATE

(75) Inventor: Albert X. Widmer, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/120,675

(22) Filed: Jul. 22, 1998

(51) Int. Cl.[7] .............................. H04B 14/04; H04J 3/04; H03M 7/00
(52) U.S. Cl. ........................ 375/242; 341/59; 370/536
(58) Field of Search ................................ 370/536, 542; 340/347; 341/59; 375/242

(56) References Cited

U.S. PATENT DOCUMENTS

| | | | | |
|---|---|---|---|---|
| 3,577,142 A | * | 5/1971 | McMillin | 340/347 |
| 3,594,560 A | * | 7/1971 | Stanley | 340/347 |
| 3,980,826 A | | 9/1976 | Widmer | |
| 4,486,739 A | * | 12/1984 | Franaszek et al. | 340/347 |
| 4,710,922 A | * | 12/1987 | Scott | 370/112 |
| 5,301,196 A | | 4/1994 | Ewen et al. | |
| 5,457,718 A | | 10/1995 | Anderson et al. | |
| 5,648,776 A | | 7/1997 | Widmer | |
| 5,757,807 A | * | 5/1998 | Tezuka et al. | 370/541 |

OTHER PUBLICATIONS

Albert X. Widmer, John f. Ewen, Mehmet Soyuer, Kevin R. Wrenner, Single–Chip 1062Mbaud CMOS Transciever for Serial data Commication, 1995 IEEE, p.p. 32–34.*

Albert X. Widmer, Kevin Wrenner, Herschel A. Ainspan, Ben Parker, Pierre Austruy, Bernard Brezzo, Anne–Marie Haen, . . . Single–Chip 4×500–MBd CMOS Transciever . 1996, IEEE, p.p. 2004–2014.*

A. X. Widmer, "A DC–Balanced, Partioned–Block, 8B/10B Transmission Code", IBM Journal of research and development, vol. 27, No. 5, Sep. 1983.

A. X. Widmer, "Self–Starting Timing Ring Circuit", IBM Technical Disclosure Bulletin, Vol. 35, No. 5, Oct. 1992.

Thomas H. Lee et al., "A 2.5 V CMOS Delay–Locked Loop for an 18 Mbit, 500 Megabyte/s DRAM", IEEE Journal of Solid–State Circuits, vol. 29, No. 12, Dec. 1994.

* cited by examiner

Primary Examiner—Stephen Chin
Assistant Examiner—Tony Al-Beshrawi
(74) Attorney, Agent, or Firm—F. Chau & Associates, LLP

(57) ABSTRACT

A method of coding parallel data for transmission while maintaining baud rate includes the steps of providing a plurality of uncoded data blocks having a predetermined baud rate, demultiplexing the data blocks to sequentially distribute the data blocks to encoders, encoding the data blocks at the predetermined baud rate, and serializing the coded data blocks for serially transmitting data at the predetermined baud rate. A system for coding parallel data for serial transmission while maintaining baud rate is included wherein the predetermined baud rate is maintained by providing an adequate number transmission links rather than increasing baud rate.

33 Claims, 8 Drawing Sheets

| Lnk #0 | Lnk #1 | Lnk #2 | Lnk #3 | Lnk #4 | Lnk #5 | Lnk #6 | Lnk #7 | Lnk #8 | Lnk #9 | Lnk #10 | Lnk #11 |
|---|---|---|---|---|---|---|---|---|---|---|---|
| $0a_0$ | $0a_1$ | | | | | | | | | | |
| $0b_0$ | $0b_1$ | $1a_0$ | $1a_1$ | | | | | | | | |
| $0c_0$ | $0c_1$ | $1b_0$ | $1b_1$ | $2a_0$ | $2a_1$ | | | | | | |
| $0d_0$ | $0d_1$ | $1c_0$ | $1c_1$ | $2b_0$ | $2b_1$ | $3a_0$ | $3a_1$ | | | | |
| $0e_0$ | $0e_1$ | $1d_0$ | $1d_1$ | $2c_0$ | $2c_1$ | $3b_0$ | $3b_1$ | $4a_0$ | $4a_1$ | | |
| $0i_0$ | $0i_1$ | $1e_0$ | $1e_1$ | $2d_0$ | $2d_1$ | $3c_0$ | $3c_1$ | $4b_0$ | $4b_1$ | $5a_0$ | $5a_1$ |
| $6a_0$ | $6a_1$ | $1i_0$ | $1i_1$ | $2e_0$ | $2e_1$ | $3d_0$ | $3d_1$ | $4c_0$ | $4c_1$ | $5b_0$ | $5b_1$ |
| $6b_0$ | $6b_1$ | $7a_0$ | $7a_1$ | $2i_0$ | $2i_1$ | $3e_0$ | $3e_1$ | $4d_0$ | $4d_1$ | $5c_0$ | $5c_1$ |
| $6c_0$ | $6c_1$ | $7b_0$ | $7b_1$ | $8a_0$ | $8a_1$ | $3i_0$ | $3i_1$ | $4e_0$ | $4e_1$ | $5d_0$ | $5d_1$ |
| $6d_0$ | $6d_1$ | $7c_0$ | $7c_1$ | $8b_0$ | $8b_1$ | $9a_0$ | $9a_1$ | $4i_0$ | $4i_1$ | $5e_0$ | $5e_1$ |
| $6e_0$ | $6e_1$ | $7d_0$ | $7d_1$ | $8c_0$ | $8c_1$ | $9b_0$ | $9b_1$ | $10a_0$ | $10a_1$ | $5i_0$ | $5i_1$ |
| $6i_0$ | $6i_1$ | $7e_0$ | $7e_1$ | $8d_0$ | $8d_1$ | $9c_0$ | $9c_1$ | $10b_0$ | $10b_1$ | $11a_0$ | $11a_1$ |
| $12a_0$ | $12a_1$ | $7i_0$ | $7i_1$ | $8e_0$ | $8e_1$ | $9d_0$ | $9d_1$ | $10c_0$ | $10c_1$ | $11b_0$ | $11b_1$ |
| $12b_0$ | $12b_1$ | $13a_0$ | $13a_1$ | $8i_0$ | $8i_1$ | $9e_0$ | $9e_1$ | $10d_0$ | $10d_1$ | $11c_0$ | $11c_1$ |
| $12c_0$ | $12c_1$ | $13b_0$ | $13b_1$ | $14a_0$ | $14a_1$ | $9i_0$ | $9i_1$ | $10e_0$ | $10e_1$ | $11d_0$ | $11d_1$ |
| $12d_0$ | $12d_1$ | $13c_0$ | $13c_1$ | $14b_0$ | $14b_1$ | $15a_0$ | $15a_1$ | $10i_0$ | $10i_1$ | $11e_0$ | $11e_1$ |
| $12e_0$ | $12e_1$ | $13d_0$ | $13d_1$ | $14c_0$ | $14c_1$ | $15b_0$ | $15b_1$ | $16a_0$ | $16a_1$ | $11i_0$ | $11i_1$ |
| $12i_0$ | $12i_1$ | $13e_0$ | $13e_1$ | $14d_0$ | $14d_1$ | $15c_0$ | $15c_1$ | $16b_0$ | $16b_1$ | $17a_0$ | $17a_1$ |
| $18a_0$ | $18a_1$ | $13i_0$ | $13i_1$ | $14e_0$ | $14e_1$ | $15d_0$ | $15d_1$ | $16c_0$ | $16c_1$ | $17b_0$ | $17b_1$ |

*Fig. 3*

TRANSFORMATION OF PARALLEL INTERFACE INTO CODED FORMAT WITH PRESERVATION OF BAUD-RATE

BACKGROUND OF THE INVENTION

1. Field of the Invention

The present invention relates to transmission codes and, more particularly, to a system and method for transforming uncoded parallel interfaces into coded format while maintaining a baud-rate of the parallel interface.

2. Description of Related Art

It is standard practice to connect chips located close together with a number of parallel lines accompanied by a clock line and other control lines. If these links extend across card or box boundaries, the raw data is usually coded for DC-balance and run-length limitation to facilitate AC-coupling, fiber-optic receiver design and clock recovery. Also, the reduced content of low frequency spectral components in the coded signals results in lower signal distortion than is normally incurred on transmission lines. The remaining, unavoidable distortion can be more readily compensated for coded signals by a variety of known techniques, such as, for example, digital predistortion according to U.S. Pat. No. 3,980,826, to Widmer, entitled, 'Means of Predistorting Digital Signals' which is incorporated herein by reference. However, these advantages can only be obtained by a reduced information content per bit transmitted because some bit patterns are not permissible. Typically, it takes more bits to transmit a given amount of information in coded form. This deficiency is usually compensated by a higher transmission rate. For information transfers at lower rates, coded data from parallel lines is typically multiplexed into a single high speed line, e.g. data from eight parallel lines operated at a 100 MHz rate is coded into ten bits, serialized and transmitted at 1 Gbaud, ten times the parallel rate, on a single serial line. Now, if the parallel rate reaches 2 GHz, this technique becomes difficult to implement. Conventional systems are practical for lower transmission rates. For example, a twenty line parallel input operated at a 400 MHz rate, may be encoded with a 4B/5B code, and transmitted on twenty lines operated at a rate of 500 Mbaud.

For high performance levels, the known approaches are not acceptable. As an example, for ten parallel lines to be operated at a higher rate, say 2 Gbaud, coding is necessary across card boundaries and may be helpful for transmission lines extending over tens of inches entirely on a card and causing noticeable signal deterioration. Links of up to a few meters distance use small gauge copper cables, and the longer links use fiber-optic technology to connect between a transmitter and a receiver. An increased transmission rate at 2.5 Gbaud would reduce the maximum range of both the low cost copper technology and the moderate-cost multimode fiber technology. Further, the increased transmission rate requires the addition of unwieldy extra clock systems to the transmitter and receiver and increases the performance requirements for the circuit technology.

Therefore, a need exists for a system and method for transmitting parallel data at higher transmission rates. A further need exists for a system which preserves a data rate from the uncoded parallel interface to a coded parallel interface by providing extra bandwidth with additional lines for the required code redundancy.

SUMMARY OF THE INVENTION

A method of coding parallel data for transmission while maintaining baud rate in accordance with the present invention includes the steps of providing a plurality of uncoded data blocks having a predetermined baud rate, demultiplexing the data blocks to sequentially distribute the data blocks to encoders, encoding the data blocks at the demultiplexed rate and serializing the coded data blocks for serially transmitting data at the predetermined baud rate.

In other methods, the step of demultiplexing may include the steps of providing a control signal with data from the data blocks to registers and dividing the data blocks in the registers into two groups and sending one group and the control signal to each encoder. The step of demultiplexing may also include the steps of providing a clock signal to synchronize the registers and sequencing the registers to provide a patterned data stream for transmitting the data blocks. The step of encoding may include the step of encoding each data block by providing a pair of encoders. The step of transforming the uncoded data blocks from a 10 line uncoded input format at an input to a 12 line coded transmission at an output for transmitting the coded data blocks is preferably included. The step of transmitting coded data blocks on a plurality of transmission links is also included.

In still other methods, the step of adjusting transmission delay by a dynamically adjustable delay in each transmission link may be included. The step of retiming coded data blocks on each link with a dedicated adjustable clock, and the step of eliminating skew among the links by providing a second retiming of data transferred on the links at a rate less than the predetermined baud rate with a clock system shared by all links may be included. The steps of receiving transmitted coded data blocks from the transmission lines at a receiver end is preferably included. The step of checking disparity to determine errors in the data blocks at the receiver end may be included. The step of encoding may further include the steps of outputting data blocks from each encoder to a disparity register and inputting disparity data from each disparity register to the encoder associated the disparity register to create a running disparity check of the data blocks. Further steps may include such as deserializing the serially transmitted coded data blocks at a receiver end to provide parallel coded data blocks, decoding the data blocks at a deserialized rate, the deserialized rate being lower than the predetermined baud rate and multiplexing the decoded data blocks to provide parallel data blocks at the predetermined baud rate. Each uncoded data block may include 10 bits and the predetermined baud rate may be greater than or equal to about 2 Gbaud.

A system for coding parallel data for transmission while maintaining baud rate includes a data input for inputting a plurality of data blocks having a predetermined baud rate. A demultiplexer is coupled to the data input for sequentially distributing the data blocks, and a plurality of encoders is coupled to outputs of the demultiplexer for encoding the data blocks distributed by the demultiplexer at a demultiplexed rate, the demultiplexed rate being lower than the predetermined baud rate. A plurality of serializers is included, each coupled to one of the encoders, for serializing coded data blocks output from the encoder at the predetermined baud rate, wherein the predetermined baud rate is maintained by providing an adequate number transmission links. Disparity control means is coupled to each encoder for maintaining an average of equal numbers of coded bits with a value of one or zero.

In alternate embodiments of the system, the demultiplexer may include registers for dividing the data blocks in the registers into two groups and sending one group and a control signal to one of two encoders associated with each register. The demultiplexer may further include a clock for providing clock signals to synchronize the registers to provide a patterned data stream for transmitting the coded data blocks. The encoders are preferably 5B/6B encoders. A plurality of transmission links may be included, coupled to the serializers for transmitting serial data-to a receiver. A plurality of deserializers to deserialize the serially transmitted encoded data blocks at a receiver end, a plurality of decoders for decoding the data blocks at a deserialized rate which is lower than the predetermined baud rate and a multiplexer for sequencing the decoded data blocks to provide parallel data blocks at the predetermined baud rate may all be included. A pair of coded data blocks may be concentrated on a transmission link such that the data blocks generate a singular synchronizing comma sequence. A transmission delay adjusting device may be included for sampling and retiming the coded data blocks on transmission lines or links. The predetermined baud rate is preferably greater than or equal to about 2 Gbaud. The input data blocks may include 10 bits each.

Another system for providing uniform data transmissions between electronic devices while maintaining baud rate includes a data input for inputting a plurality of 10-bit data blocks having a predetermined baud rate. A demultiplexer is coupled to the data input for sequentially distributing the data blocks among outputs of the demultiplexer. A pair of 5B/6B encoders are coupled to each of the outputs of the demultiplexer for encoding the data blocks distributed by the demultiplexer at a rate lower than the predetermined baud rate. A serializer is coupled to each of the encoders, for serializing coded data blocks output from the encoder at the predetermined baud rate. A transmission line is coupled to each serializer for transferring data to a receiver. Disparity checking means includes for determining errors in the received data blocks, the disparity checking means including a register being coupled to each decoder, and a timing means is included for sequencing data blocks to the encoders in accordance with the predetermined baud rate.

In alternate embodiments, the demultiplexer may include registers for dividing the data blocks in the registers into two groups and sending one group and a control signal to one of two encoders associated with each register. The timing means may include a clock for providing clock signals to synchronize registers provided in the demultiplexer to provide a patterned data stream for transmitting the data blocks. A deserializer may be coupled to each transmission line on a receiver end to deserialize serially transmitted encoded data blocks at the receiver end to provide parallel coded data blocks. A decoder may be coupled to the deserializers for decoding the encoded data blocks at a rate lower than the predetermined baud rate. A multiplexer for sequencing the data blocks may provide parallel data blocks at the predetermined baud rate. A transmission delay adjusting device may be included for sampling and retiming transmission rates for the serially transmitted data on the transmission lines. The predetermined baud rate may be greater than or equal to about 2 Gbaud. Transmitted data blocks may be conditioned by digital or analog preemphasis to reduce distortion.

BRIEF DESCRIPTION OF DRAWINGS

The invention will be described in detail in the following description of preferred embodiments with reference to the following figures wherein:

FIG. 3 shows a detailed bit and byte order of coded bits on transmission links in accordance with the present invention;

DETAILED DESCRIPTION OF PREFERRED EMBODIMENTS

The present invention relates to transmission codes and more particularly, to a system and method for transforming uncoded parallel interfaces into coded format while maintaining a baud-rate of the uncoded parallel interface. This invention addresses the problem of massive, high-speed digital information transfer between electronic entities. The system and method of the present invention will be described herein with reference to illustrative embodiments.

The system in accordance with the present invention includes a transmitter interface having a demultiplexer with a plurality of output branches. The number of output branches from the demultiplexer equals the number of bits in the coded block, six, for example, or an integer multiple thereof. The demultiplexer directs a first ten-bit byte to a first parallel pair of 5B/6B encoders. The next byte is assigned to a second pair of encoders and so on up to a sixth pair. Starting with the seventh byte, the cycle repeats starting again with the first pair of encoders. Each pair of encoders is followed by a pair of serializers which are connected to a pair of transmission lines. At the receiving end, the complementary functions of deserialization, decoding and multiplexing back to a single stream of ten-bit bytes is performed. The present invention thereby transmits coded data, along a plurality of links, transformed from an uncoded parallel interface at the same rate as received from the uncoded parallel interface.

Transmission Code

Figure 1:
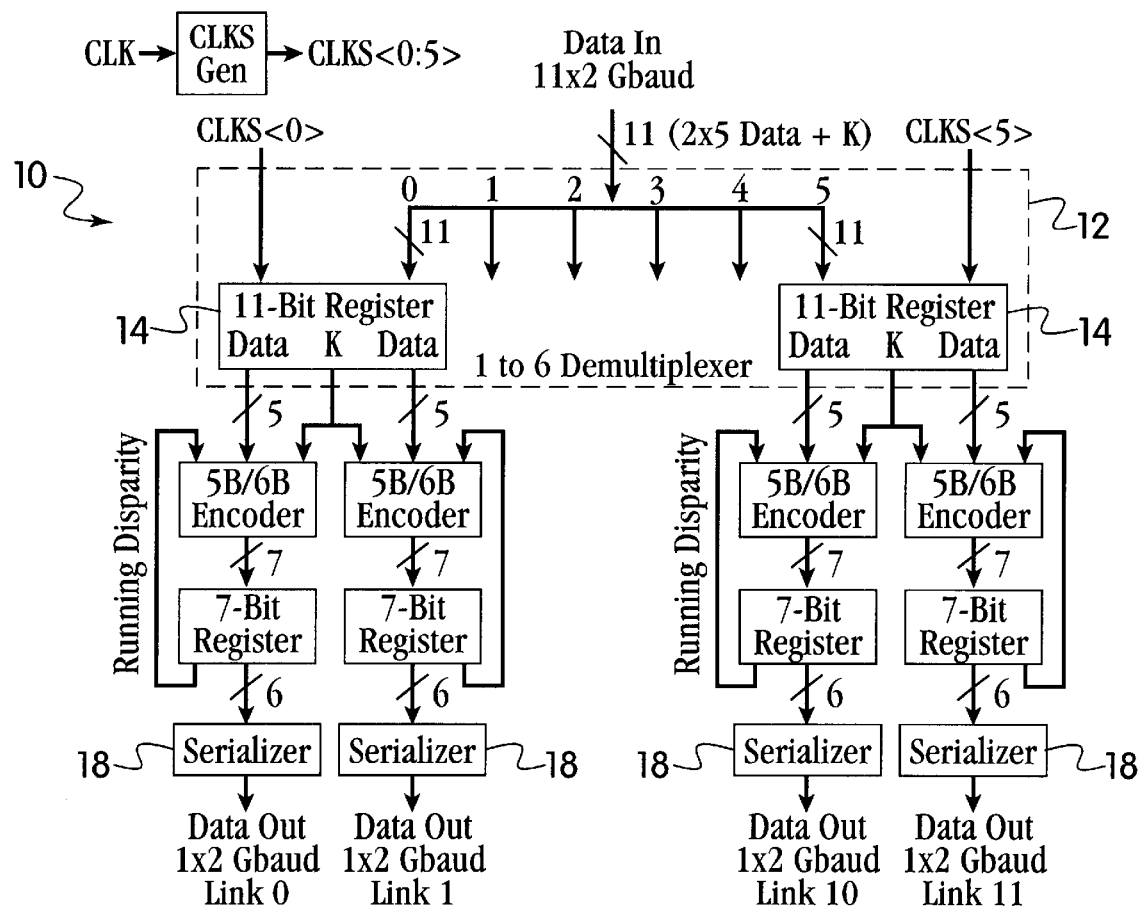
FIG. 1 is a schematic diagram of a transmitter showing data flow in accordance with the present invention.

A 10B/12B transmission code of the present invention is preferably implemented for compatibility reasons with the defined data format and the number of available transmission lines. Ribbons of 12 optical fibers with connectors at both ends are currently offered in the market. In this illustration, there are 12 transmission lines labeled Link0 through Link11 as shown in FIG. 1. Transmission lines Link0–Link11 may be electromagnetic or optical transmission lines. In the pure data domain, the 10B/12B transmission code is implemented using a 5B/6B code which is identical to the 5B/6B portion of the Fibre Channel 8B/10B Transmission Code as is known in the art and described in U.S. Pat. No. 4,486,739 incorporated herein by reference.

For purposes of special, non-data characters, for example a comma, the 5B/6B code is expanded to a 10B/12B code using a pair of contiguous 6B vectors (2×5B/6B=10B/12B). For example, referring to FIG. 2, $a_0b_0c_0d_0e_0i_0$ and $a_1b_1c_1d_1e_1i_1$ are needed to define these non-data characters. For the present invention, the comma-character is a special character of interest. It can be used to mark and recover quickly, and to monitor the byte and packet boundary alignments for each individual link regardless of the respective skew.

The comma-pattern is '11111011' or its complement '00000100'. The nomenclature for input values includes the form K28.13, where the letter K indicates a special, non-data character as opposed to D for data, and the numbers 28 and 13 represent the uncoded 5-bit patterns '00111' and '10110', respectively, which are binary values of the decimal numbers 28 and 13, respectively, with the low order bit leading.

The complete comma-character is '−001111 101100+' or '+110000 010011−' and can be generated by K28.13 with some coder circuit modification to complement K13 in special characters if the running disparity at the start of K13 is negative. Analogous circuit modifications have been implemented for all K28 special characters with balanced 4B vectors in the Fibre Channel code. In the absence of errors, it is sufficient to monitor the seven bolded digits ('−001111 101100+' or '+110000 010011−') for the comma detection.

Figure 2:
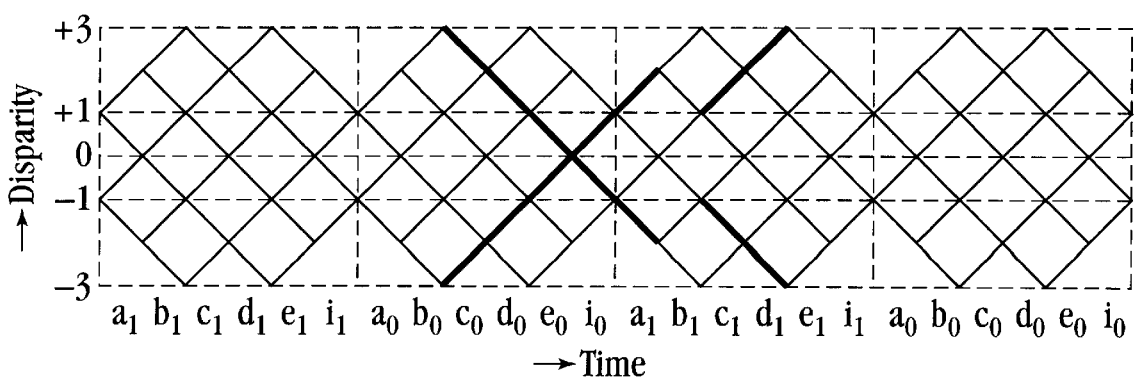
FIG. 2 is a trellis diagram for a 10B/12B code showing disparity rules in accordance with the present invention.

Referring to FIG. 2, a trellis diagram shows one set of allowable sequences of coded bit values versus disparity for the 10B/12B code. A bit value one or zero is represented by a line segment with positive or negative slope, respectively. From the trellis diagram, it is immediately evident that the comma-sequence is singular as required, i.e. it uniquely identifies the 12B byte boundaries in the absence of errors.

All bit combinations in the trellis diagram are allowed with the following exceptions:

1. The first four bits of any 5B/6B vector ($a_0b_0c_0d_0$ or $a_1b_1c_1d_1$) cannot be identical.

2. The last four bits of the second 5B/6B vector ($c_1d_1e_1i_1$) cannot be identical.

3. The last four bits of the first 5B/6B vector ($c_0d_0ei_0$) are identical for the comma-character but are never identical for data.

Keeping in mind the above three constraints, the following characteristics of the code can be derived from the trellis diagram of FIG. 2:

1. The maximum run-length is five with at most two contiguous runs of five in data, for example, +011100+000111+110001+. The comma character may generate three contiguous runs of 5, such as +011100+000111+110000−010011−.

2. The minimum sustainable average transition density is three per 12-bit interval, for example, the bit pattern '+100001−111000−011110+000111+' can be repeated indefinitely. Any specific 12-bit interval may have as few as two transitions.

3. The code is DC-balanced with a maximum digital sum or running disparity variation of ±3. In the steady-state condition (ignoring irrelevant start-up abnormalities), all 6B vectors start and end with a running disparity of ±1.

4. The transient normalized maximum DC-offset is (13/6)=2.17. The normalized maximum DC-offset is derived from the trellis diagram and is defined as the average area (bit interval×disparity) per bit-interval enclosed between the zero-disparity line and the outermost contour any valid code vector can traverse, which is +110100+ or −001011− for the 5B/6B code. By simulations, it can be shown that at the 2 Gbaud rate of the example, a 3 dB low frequency cutoff at 3.9 MHz produces an eye amplitude closure of 0.5 dB. A cutoff at 7.9 MHz generates a closure penalty of 1 dB for a worst case pattern. It is generally desirable to operate with a high low frequency cut-off in order to filter out low frequency noise from several sources and to permit small reactance values for AC-coupling. As an example, optical receiver designs usually have at least one high-pass filter on chip and so it may be important to reduce the size of the required capacitance.

5. The maximum error spread caused by an error in the coded data is five contiguous decoded bits.

In a preferred embodiment for an input of ten parallel data lines, the 5B/6B code is implemented, although other codes may be more suitable for application with a different number of input lines.

Transmitter Output Baud-Rate

The coded bit-rate at the transmitter output equals the uncoded byte-rate delivered to the transmitter for some of the following reasons:

1. A frequency synthesizer is not necessary to generate the higher rate clocks. Further, associated separate clocking systems and counters at both the transmitter and the receiver side are no longer necessary.

2. The present invention significantly reduces the buffer requirements and complex timing alignments at the transmitter side.

3. The containment of all transceiver operating rates to no more than the input rate relaxes circuit performance parameters and signaling requirements on the transmission links.

Transceiver Data Flows

Transceiver data flow will now be described with reference to the various system components.

Transmitter

An illustrative transmitter 10 of the present invention is shown in FIG. 1. The data input (Data In) is operated at a predetermined rate. The present system accommodates an input rate of, for example, 2 Gbaud/line. Other data input rates are contemplated for this invention as well. The input rates may be less than or greater than the illustrative 2 Gbaud/line. Further, since the invention efficiently handles data, it would be advantageous to use the present system for any input rate. The sequential input data is organized into fixed length flits. The expression 'flit' stands for Flow-Control Digit. It is a basic unit or segment of transmitted information containing error-control, flow-control and sequencing information. In this example, eight lines carry 32 bytes of payload data; two additional lines carry 64 bits of control information. Inputs with variable length packets are also suitable for this invention.

Input Interface

In a preferred embodiment, the complete input at Data In includes 12 lines: A half-rate (or full-rate) clock line CLK (for example, 1 GHz), a control line (K), and ten lines of unrestricted uncoded data. The control line K governs the insertion of non-data synchronizing comma-characters for the determination of the 6B coded block boundaries at a receiving end and usually also provides information about the flit boundaries and may indicate whether a particular flit is a data flit or an idle flit. The exact format will vary according to the system.

Input Time Multiplexer

A time demultiplexer circuit 12 separates the input into six parallel streams labeled 0–5, operating at one sixth the input data rate (for example, 3 ns intervals). A circuit 'CLKS GEN' generates six selector clocks CLKS<0:5> which in sequence pick one byte from the input data stream and direct it to one of the six branches. A suitable circuit for this function has been published by A. X. Widmer, 'Self-Starting Timing Ring Circuit', IBM Technical Disclosure Bulletin, Vol.35, No.5, October 1992, pp 446–448. A first selector clock pulse CLKS<0> samples the 11-bit byte #0, #6, #12, and so on into a first 11-bit register 14. The bytes #1, #7, #13, and so on are sampled one byte interval (for example, 500 ps) later by clock CLKS<1> into a second register (not shown). All the other four sets of modulo six bytes are transferred the same way by the respective clocks CLKS<2:5> into their corresponding registers 14.

5B/6B Encoding

The 11-bit bytes are then separated into two parallel 5-bit streams with a common K-bit. The ten data bits are assigned to a pair of parallel 5B/6B encoders (five bits each) in arbitrary order. Using Fibre Channel notation, the uncoded bits are labeled $A_0B_0C_0D_0E_0$ and $A_1B_1C_1D_1E_1$, The flit synchronization line becomes the K-input for both encoders. It forces a K-character (K28 or K13) when asserted. Another signal input 'Running Disparity' is added to each encoder input to provide the starting disparity for each 6B encoding cycle. The running disparity is a parameter output from the preceding encoding cycle. For the usual Fibre Channel implementation, each encoder includes about 37 gates up to 8 levels deep. The result of each encoder is captured in 7 latches $a_0b_0c_0d_0e_0i_0$ $RD_{e0}$ and $a_1b_1c_1d_1e_1i_1$ $RD_{e0}$, where $RD_{e0}$ hold the respective ending running disparity values which are either +1 or −1 and are fed forward to the encoder input for the next cycle. The six bits '$a_xb_xc_xd_xe_xi_x$' represent the coded data format.

Figure 5:
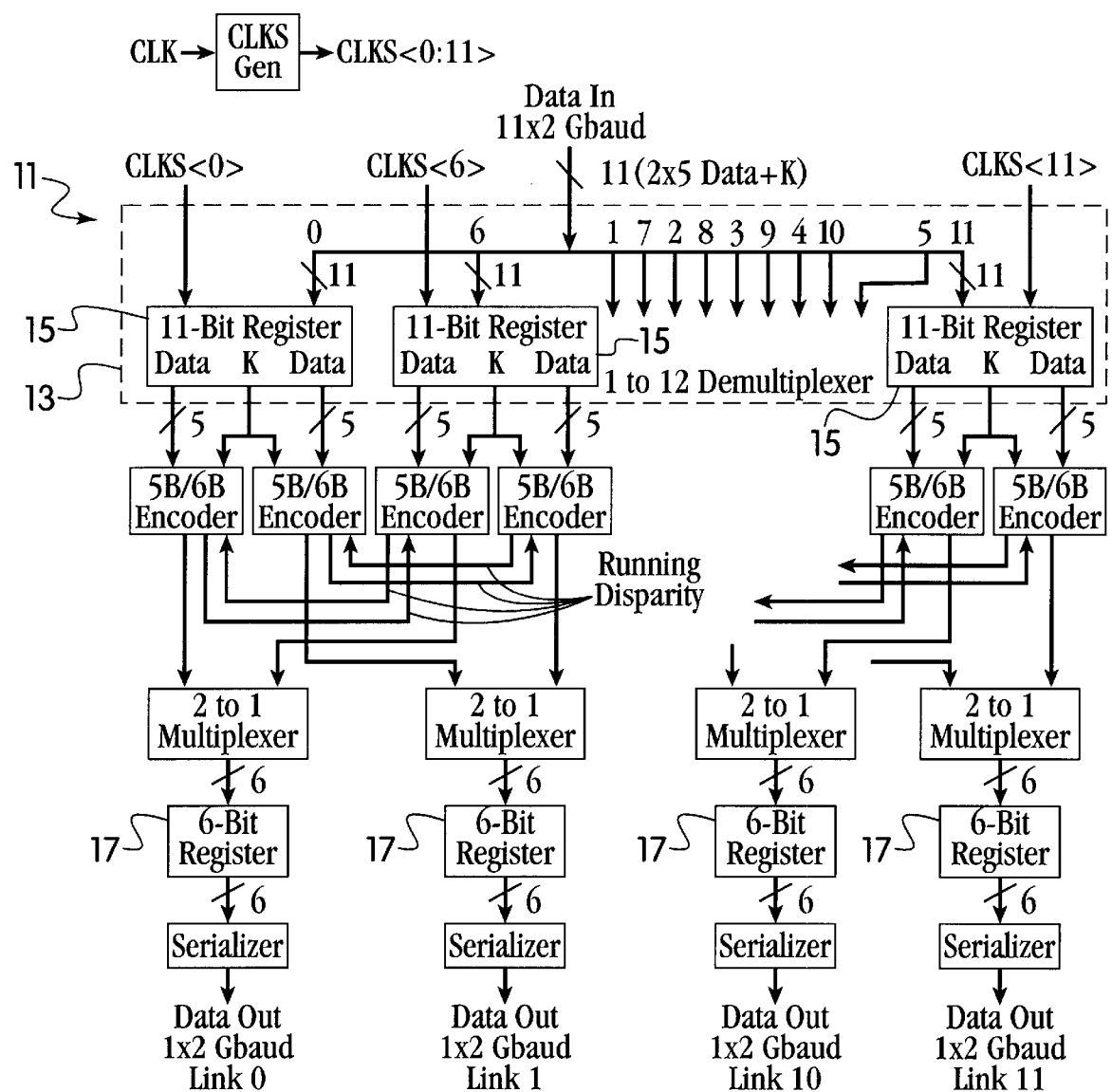
FIG. 5 is a schematic diagram of a transmitter with dual encoders for each transmission link for enhanced performance showing data flow in accordance with the present invention.

In this example, the encoding must be accomplished within less than 3 ns. If the technology cannot support this constraint, it can be relaxed to 6 ns using supplemental parallel circuits as shown in FIG. 5. In FIG. 5, a transmitter 11 is shown. A clock generator (CLKS Gen) and a demultiplexer 13 are both expanded to 12 branches. Twelve 11-bit registers 15 are updated at one twelfth the input rate. Link0 and Link1 are fed new data alternately by the selector clocks CLKS<0,6>, link2 and Link3 are fed by CLKS<1,7>, and so on. All 5B/6B coders are doubled up and followed by AND-OR selector circuits controlled by a set of control signals from the CLKS-GEN circuit so the outputs of the original and the supplemental encoder can be loaded alternately into a single 6-bit register 17. On each link, 6B coded vectors are inserted alternately from the original and the supplemental encoder output. The running disparity control line has to be rerouted from the original coder output to the supplemental coder input and vice-versa. The delay chain for this feed-forward disparity signal inside the coder includes a 2×2-way AOI and a 2-way EX-Or circuit, so the encoder circuit can easily process it in less than 3 ns.

Another approach to relax the performance requirements for the encoder and decoder circuits depends on relocating these circuits in the source to destination data flow. The high speed data bus is usually assembled from much slower parallel structures. The 10-bit 2 Gbaud bus of this example could originate from ten 8-bit bytes (8 data bytes plus 2 control bytes) operating on 250 MHz cycles. The 80 bits can then be coded by sixteen 5B/6B encoder circuits within a 4 ns interval. The resulting 96-bit wide bus consisting of eight coded 6-bit pairs is then multiplexed into a 12-bit bus operating at 2 Gbaud. In a final step, the coded 6-bit vectors are serialized and the coded bits are delivered to the transmission lines (Links) in the order illustrated in FIG. 3 and FIG. 4 in accordance with the present invention. At a receiving end 25 (FIGS. 6–9), a complementary structure of deserializers, demultiplexers and decoder circuits can be implemented. The several implementations described above are compatible since both have the bit arrangements on twelve lines.

Serialization and Link Assignments

Referring again to FIG. 1, each pair of coded sextuplet bits ($a_xb_xc_xde_xi_x$) is serialized in a separate circuit and transmitted on a separate link (Link0–Link11). The output (Data Out) from serializers 18 has a bit-rate equal to that of the input (Data In) from the uncoded interface.

Referring to FIG. 3, starting from any byte labeled #0, the links #0 and #1 carry each one half of the coded serial byte #0, #6, #12, and so on. The links #2 and #3 carry the byte #1, #7, #13, and so on. The 6B-vector boundaries on links #2 and #3 are delayed with respect to the boundaries on link #0 and #1 by one bit-interval (500 ps). The same scheme is followed for all the other eight links and so the byte #6 will exactly fit behind byte #0 on the links #0 and #1, byte #7 fits behind byte #1 on the links #2 and #3, and so on. The arrangement is illustrated in FIG. 3, where $0a_0$ and $0a_1$ refer to the coded 'a' bits of byte #0 and so on.

Figure 4:
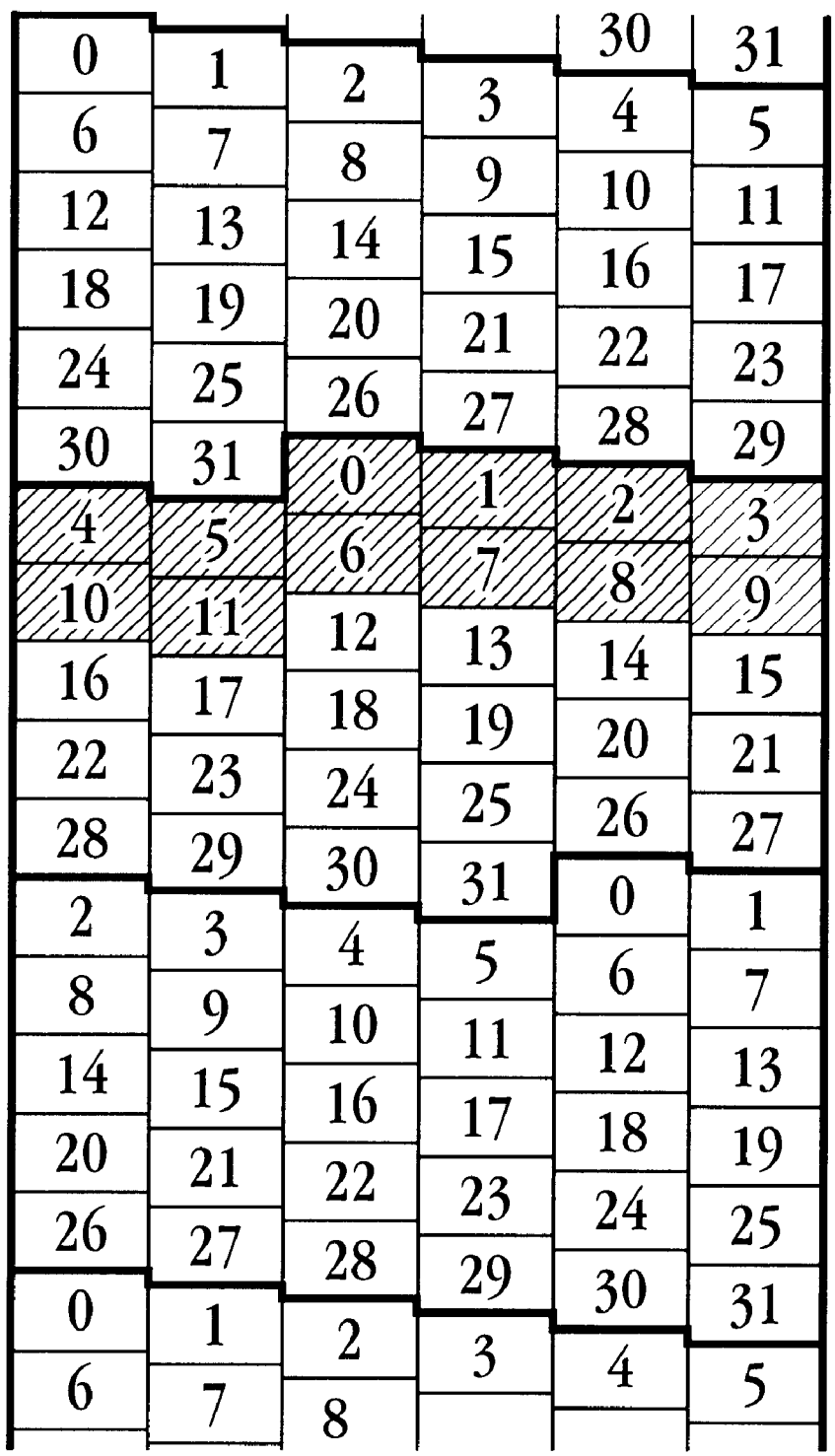
FIG. 4 is a diagram,showing flit and byte order on transmission links in accordance with the present invention.

The byte slot assignments are illustrated in more condensed form in FIG. 4 where each column represents a pair of links with identical 6B vector alignment. Each rectangular box represents the two encoded 6B vectors $a_0bc_0d_0e_0i_0$ and $a_1b_1c_1d_1e_1i_1$ representing an input byte and the number in the box is the flit byte number in the order of transmission 0 to 31.

Idle Flits, Flit and Byte Boundary Demarcation

An unconstrained number of contiguous data flits can be transmitted. If there is no data to transmit, idle flits are generated. Comma-characters are inserted in the idle flit, so the byte and flit boundaries can be easily found and checked at a receiver during normal operation without special training sequences. For the example illustrated in FIG. 4, the start of a 32-byte idle flit is marked by the comma-character in the leading position on each of the 12 links as shown by the shaded byte positions 0–11.

Many alternate approaches are possible. The comma characters are not necessarily in the leading positions of the flit, if other means for distinguishing data and idle flits are provided in the flit architecture. The leading idle characters may then be used to transmit other control information with minimum latency. However, the comma-characters should always be in known byte positions so the counters which keep track of the flit-boundaries can be properly adjusted. Another point is that it is not necessary to transmit commas for all links in a single flit. In the example at hand with 12 lines and 32-byte flits, it is sufficient to supply 4 comma characters at a time and all lines will eventually be supplied with commas in a succession of idle flits. The same holds, if the flits are 16 or 8 bytes or a mix of the above sizes. For the example illustrated in FIG. 4, a good alternate comma location is the cell pairs 24/30 and 25/31, marking the end of a flit on 4 links at a time. On the other hand, if the Idle Flit-size were uniformly 12 bytes, the simplest solution would be to supply 12 commas at once.

To generate the comma-characters at the positions shown in the FIG. 4 with an encoder design, the first six (#0 to #5) 10-bit input bytes of an Idle-Flit contain two K28 (ABCDE K=00111 1) vectors each. The next six (#6 to #11) bytes contain two K13 ABCDE K=10110 1) vectors. The K in this second set of bytes signals that the special disparity rules must be followed. Complications may arise due to the use of 5B/6B coding which cannot provide a comma in a single vector. Only a pair of contiguous 6B vectors can provide a comma which does not degrade transmission parameters. The uncoded content of the idle flits may be generated in the data source or a special shared idle flit generator in the transceiver. The data source must as a minimum identify Idle Flits and their boundaries.

In this example, the comma-character performs the following functions:

1. Establish the 6B and 12B coded vector boundaries for each individual link. Clocks with a six-bit cycle-time are synchronized to these boundaries.

2. Establish the flit-boundaries. A clock with a flit cycle-time (32 bit-intervals) is synchronized to the boundaries.

3. Identify the link with the first bit of the current flit. For a 32-byte (10 bits/byte) flit, the location of the first bit progresses with each flit cycle from link #0 to #4, to #8, and back to #0. A clock circuit keeps track of this.

4. Identify flits as Data-Flits or Idle-Flits. Data-Flits do not include any comma-character. Alternatively, the identification may be performed by control bits in the flit header.

The remaining bytes of an Idle-Flit contain information for link management and diagnostic purposes similar to the Odysseus-Prime chip. Odysseus-Prime is a Prizma support chip developed by International Business Machines, Inc. Some of the messages carried by Idles are: Back-Pressure or Flow-Control, Unwrap, Remote Wrap, NOS (Not Operational Signal), and OLS (Off Line Signal). There are also bytes assigned to carry status, control, or diagnostic signals which change only at a slow rate. A monitor circuit assures that any change is communicated before a specified time has elapsed. This feature is used to eliminate extraneous low rate signaling wires between boxes.

For applications with variable length packets, the data packets would also include comma-characters to mark the start and end of data packets similar to techniques used in the known Fibre Channel architecture.

Signal Conditioning

The data output from the transmitter of FIG. 1 may be launched on fiber optic or electromagnetic transmission lines (Links). At the high rates of this example, the signal distortions introduced by frequency dependent parameters of electromagnetic lines require compensation even for short links. This may be done with preemphasis at the transmitter or by compensation at the at the receiver. The preferred embodiment uses digital preemphasis techniques at the transmitter similar to those described in U.S. Pat. No. 3,980,826, to Widmer, entitled 'Means for Predistorting Digital Signals', which describes the techniques for Manchester type coded signals with a run-length of at most two. The same technique can be used for the 5B/6B code of this example, but even better results can be obtained by using more than two discrete transmitter levels of each polarity governed by the particular run-length.

Receiver Data Sampling

Figure 6:
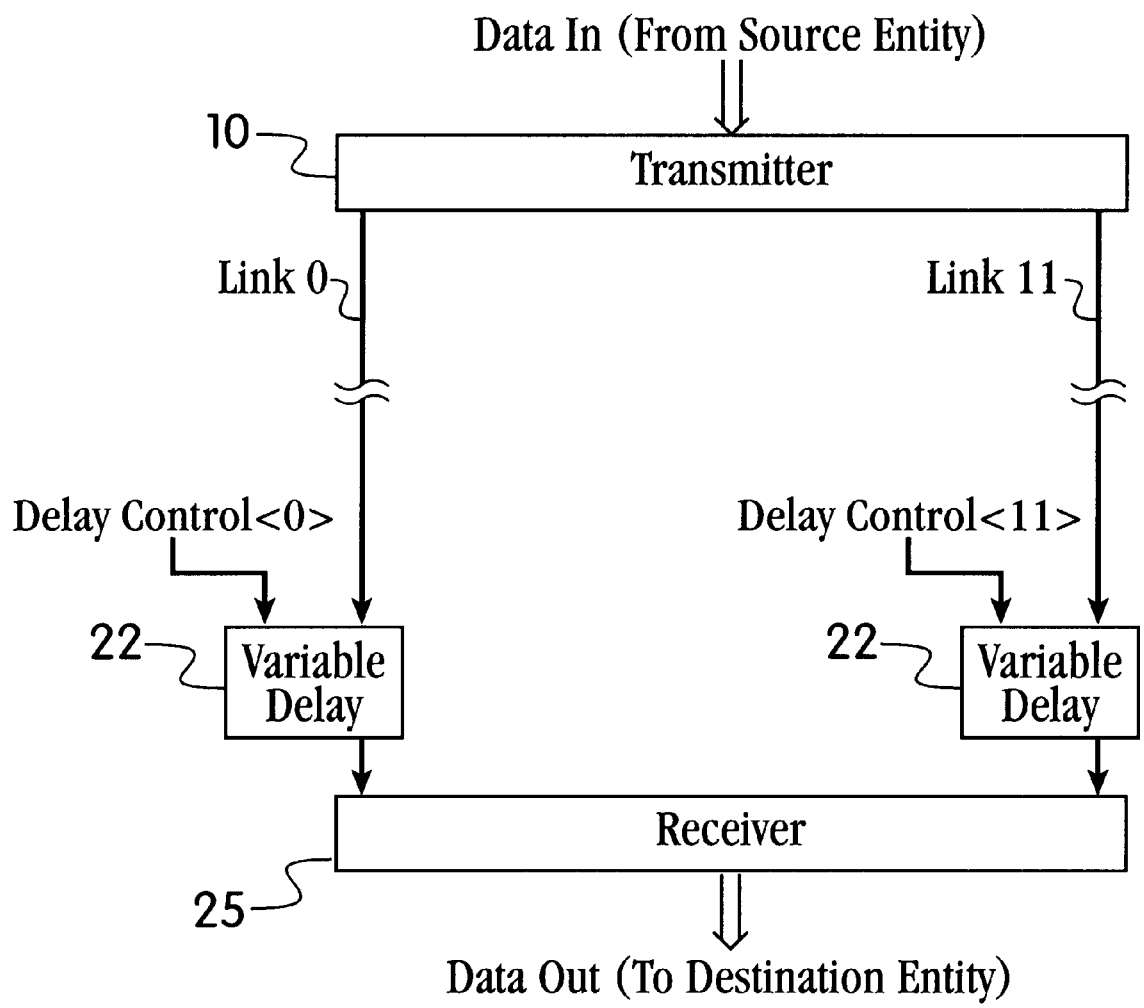
FIG. 6 is a schematic diagram of a system of the present invention showing a receiver end of transmission links with variable delay for skew compensation in each transmission link in accordance with the present invention.
Figure 7:
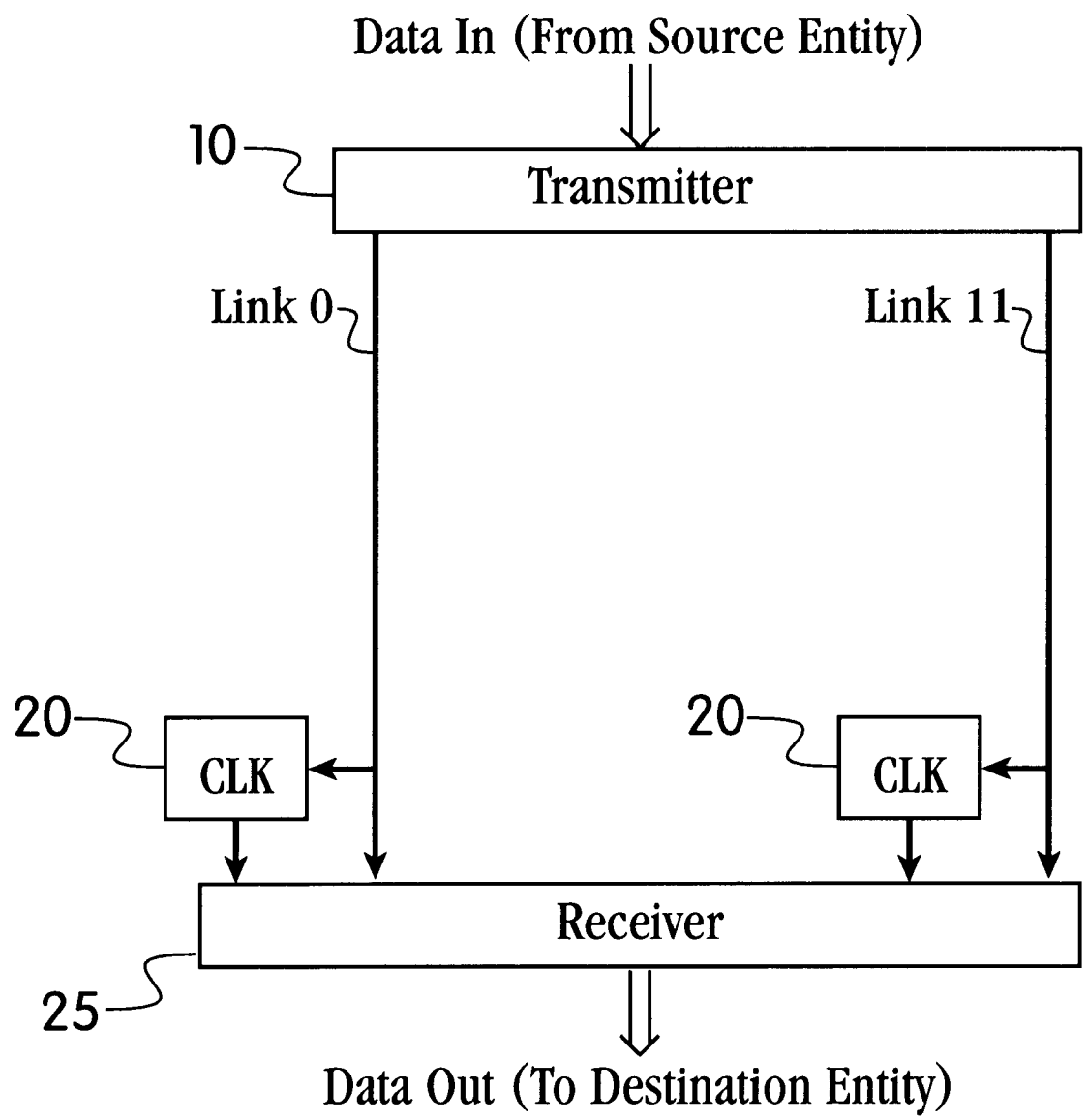
FIG. 7 is a schematic diagram of a system of the present invention showing a receiver end with individual retiming for each transmission link and absorption of skew at the output of the decoder in each transmission link in accordance with the present invention.
Figure 8:
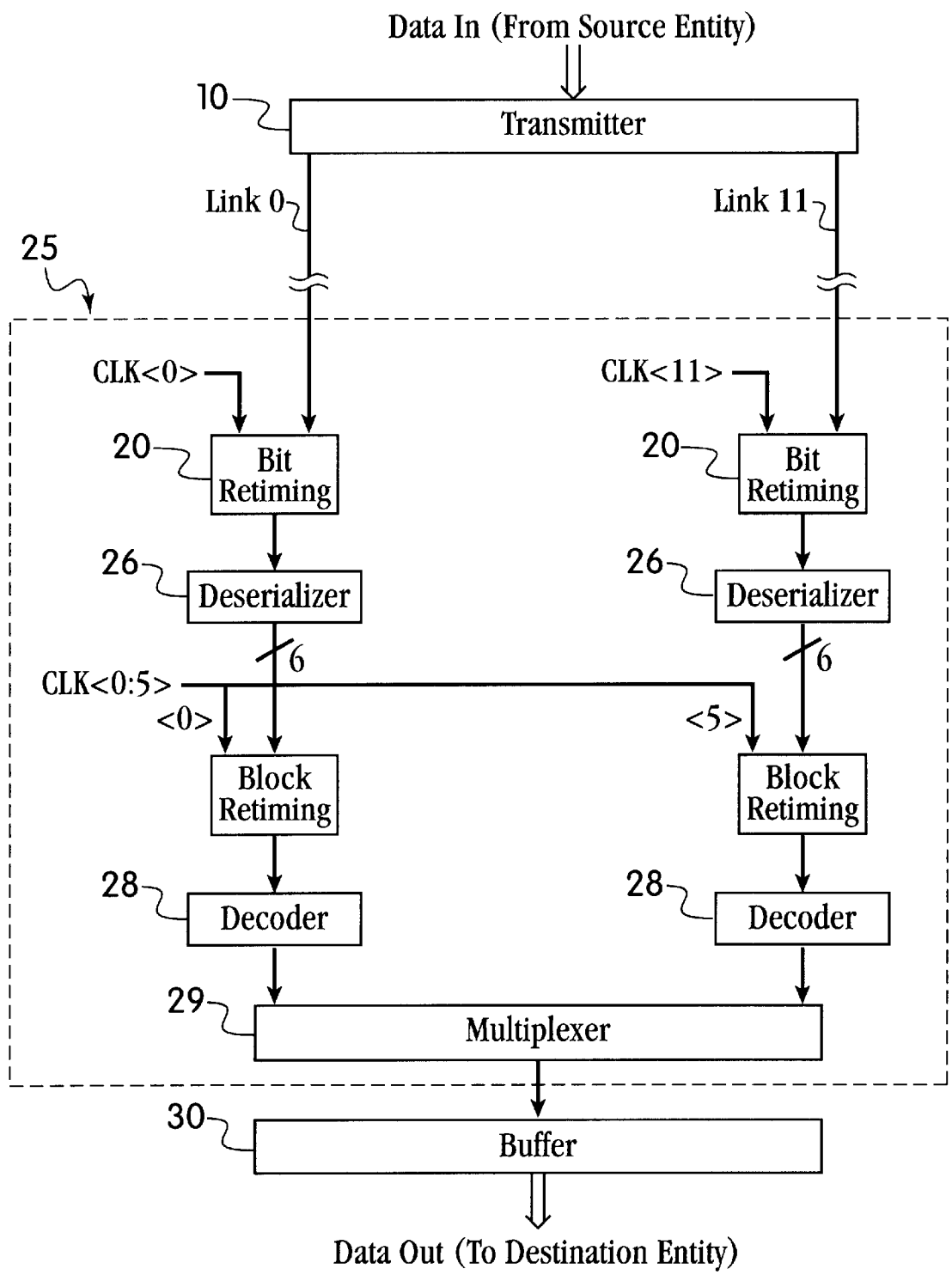
FIG. 8 is a schematic diagram showing data flow from a transmitting entity to a receiving entity in accordance with the present invention.

Referring to FIGS. 6, 7 and 8, a receiver end 25 is shown at which, the transmitted bits are preferably sampled precisely in the center of the eye diagram taking into account significant skew among the several links. An eye diagram shows the superposition of all possible waveforms synchronized to an ideal or near jitter-free clock. There are two major technical approaches for this task. Each approach is described in the following two embodiments:

1. Referring to FIG. 6, a dynamically controlled delay 22 is introduced into each link so all links can be sampled and retimed by a single shared clock. An example of this approach is described in U.S. Pat. No. 5,457,718, Anderson et al., entitled 'Compact Phase Recovery Scheme using Digital Circuits' which is incorporated herein by reference.

2. Referring to FIGS. 7 and 8, a clock 20 is phase-adjusted for each individual link for bit sampling and retiming. After deserialization and expansion to multiple lines per link, operating at a lower rate (for example, 3 ns intervals), a shared lower rate clock CLKS <0:5> (FIG. 8) captures data from all links into a common time domain for further processing.

The first embodiment requires less circuit area and can often be implemented with standard logic circuits, but it is more difficult to build a high resolution delay circuit for coded data than for a clock circuit. Also, the possibility of running into the upper or lower limits on delay is not attractive, especially for large skew variations during operation after start-up calibrations. The first approach is preferable for a skew range of less than a bit-interval.

The second embodiment usually provides more precise sampling and combined with the 10B/12B coding scheme imposes virtually no limit on the allowed range of skew. Circuits can be built for continuous, dynamic clock-phase adjustments over a full clock cycle and beyond. Phase differences beyond a bit-interval are easily accommodated by digital store and forward operations. These advantages are usually obtained at the cost of either more chip area or increased circuit complexity.

Receiver Clocks

Both embodiments described above with reference to FIG. 6 and FIGS. 7 and 8, presume the availability at the receiver location of a clock operating at the baud-rate or an integer fraction of the baud-rate. This clock may be transmitted along with the data on a dedicated line or it is recovered from a coded data stream, eliminating the need for a separate clock line. A circuit suitable for clock recovery using a PLL is described in U.S. Pat. No. 5,301,196, to Ewen et al.,entitled 'Half-Speed Clock Recovery and Demultiplexer Circuit'.

Referring to FIGS. 7 and 8, since there is no explicit clock line, a clock must be recovered, preferably at half the serial baud-rate from a coded serial bit stream. One embodiment includes a dedicated phase-locked loop (PLL) for each link (which may be included as part of the clock indicated in FIG. 7). In a second embodiment, a single PLL provides several discrete clock phases where all phase increments are equal and a known precise fraction of a bit interval (which may be included as part of the clock indicated in FIG. 8). Multiple delay-locked loops generate the precise individual clock phases required for each link by interpolation between a pair of adjacent coarse clocks governed by individual phase comparators and loop-filters for each link. An embodiment using delay-locked loops has been published by T. H. Lee et al., 'A 2.5V CMOS Delay-Locked Loop for an 18 Mbit, 500 Mbyte/s DRAM', IEEE Journal of Solid-State Circuits, Vol.29, No.12, December 1994, pp 1491–1496.

Referring to FIG. 8, each of twelve deserializers 26 is controlled by clocks (CLK<0:11>) derived from the phase adjusted clock 20 for that particular link. After deserialization to a six-line/link width, data remains stable for intervals of close to 3 ns. Thus, if the skew between any two links remains well within these limits, there is enough margin to reclock all 72 lines of the twelve links at this point with a set of clocks CLKS<0:5> to eliminate the skew. The clocks CLKS<0:5> are ⅙th-rate clocks staggered by 0.5 ns but otherwise of uniform phase and all originating from a shared source clock, e.g. CLKS<0> which is aligned with the serial bit-stream of link#0. This common set of clocks controls all functions thereafter to the point where the data is placed into a storage cell of a buffer 30 through decoders 28 and a multiplexer 29. All functions at the output side of buffer 30 are usually controlled by a clock provided by a destination entity, as indicated in FIG. 8.

No training sequences except the normal idle traffic for initial clock recovery are needed. If the circuits detect repeated symptoms of asynchronism at the bit, byte, or flit level, they automatically invoke procedures which quickly reestablish synchronism.

Receiver Implementation

Figure 9:
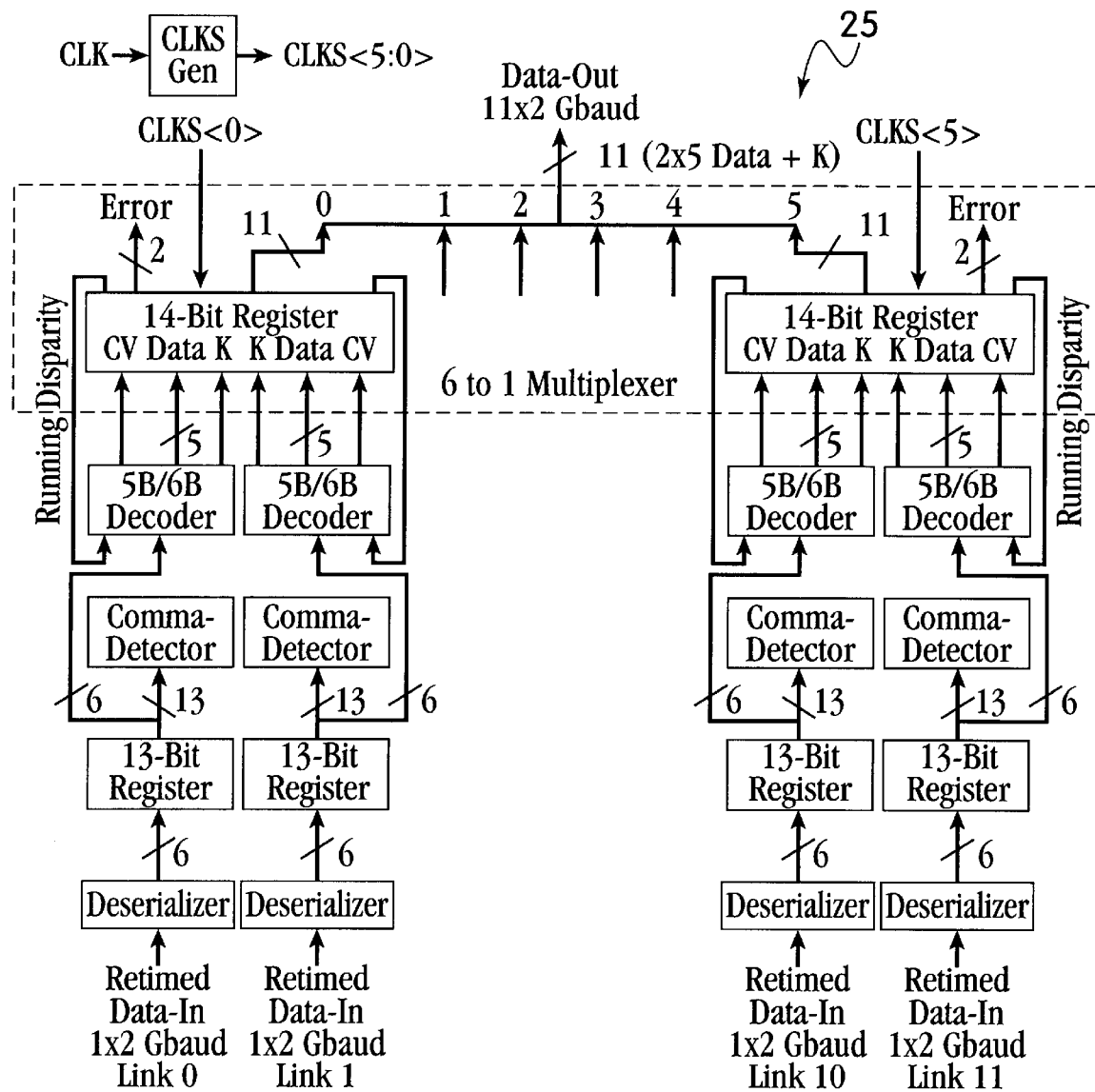
FIG. 9 is a schematic diagram showing the serial to parallel conversion, block alignment, decoding and multiplexing in the receiver in accordance with the present invention.

Various options for clock recovery and delay adjustments for the sampling and retiming of data have been enumerated above with references to possible implementations. The receiver aspects related more closely to this invention are illustrated in FIG. 9 which presumes a retimed input with uniform timing (similar to that employed in FIG. 6). To illustrate the complementary nature of the transmitter and receiver structure, the data flow in FIG. 9 is from the bottom up.

Deserializer

Referring to FIG. 9, after retiming, data from each link enters a serial to parallel converter. The front end is a deserializer which presents at its output six contiguous bits at a time with arbitrary 6B boundary alignment. The deserializer is followed by comma detection circuits and circuits to align the parallel data with the correct 6B vector boundaries. A detailed example of a suitable deserializer and comma detection circuit (for an 8B/10B coded bit-stream) can be found in U.S. Pat. No. 5,648,776, to A. X. Widmer, entitled 'Serial-to-Parallel Converter using Alternating Latches and Interleaving Techniques' which is incorporated herein by reference.

As illustrated in FIG. 2, the comma extends over eight bit-intervals. A comma detector circuit operates at a rate of ⅙ of the serial rate and checks for the comma in 6 different positions, so it must have access to 8+(6−1)=13 contiguous bits which are presented by a 6-wide and 3-deep shift-register (6-bit registers in the two leading positions trailed by a single latch) shifting at ⅙ the serial rate. Outputs from the comma detector circuit can be used for coarse (one-bit interval steps) equalization of the delays, either in the analog or the digital domain, or a combination of both.

If the expected skew among all 12 links is less than a bit interval, a single comma detection circuit (for example on Link#0) can be shared.

6B/5B Decoder

6B/5B decoder circuits are very similar to the encoder circuits shown in FIG. 1. It takes about 38 gates to recover the uncoded ABCDE K bits and about another 14 gates for an exhaustive error check, not counting the two latches required to keep track of the disparity from byte to byte. The seven output lines of the 6B/5B decoder are five decoded data lines, the special character marker K, and an error indicator CV (Code Violation) which allows the tracing of errors to an individual link.

Receiver Output

The outputs from the six pairs of decoders operating at one sixth the serial-rate are stored in a 14 bit register for each pair of links. Ten decoded data bits and the K-bit from these registers are time multiplexed into a single byte stream operating at the bit-rate. Optionally, the data may be placed into a buffer, before or after the multiplexer. To accommodate flow control for the data-rate and bus-width of this example, the receiver circuitry must provide more than twenty ten-bit bytes of buffering for each meter of one-way link-length. A buffer may also be necessary for operation with a slight (for example <±0.0002) clock difference between the source entity and the destination entity which reads data at the full rate from the buffer using its own clock.

Again, if the available technology cannot perform decoding and error checking in the allowed time slot, parallel circuits, analogous to what is shown in FIG. 5 for the transmitter, can double the allowed time. In parallel with the original 6B/5B decoders shown in FIG. 9, supplemental decoders are then provided with cross-linked disparity lines. Tracking of the received running disparity is required for the support of comprehensive error checking and hardware diagnostics. The output of the dual encoders is followed by an expanded multiplexer with 12 input branches governed by a set of clocks CLKS<0:11> which regenerates the original uncoded 10-bit byte-stream at the original 2 Gbaud rate of the transmitter.

The present invention provides bandwidth for code redundancy by additional transmission lines rather than by an increased baud rate as is conventionally used. Although illustratively described, the present invention extends to codes other than 5B/6B. Also, the number of transmission lines may be adjusted according to the code and bus width used.

Having described preferred embodiments of a novel system and method for transforming parallel interfaces into coded format with preservation of baud rate (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method of coding parallel data for transmission while maintaining baud rate comprising the steps of:
providing a plurality of uncoded data blocks having a predetermined baud rate;
demultiplexing the data blocks to sequentially distribute the data blocks to encoders;
encoding the data blocks at the demultiplexed rate;
serializing the coded data blocks for serially transmitting data at the predetermined baud rate; and
transmitting the coded data blocks on a plurality of transmission links.

2. The method as recited in claim 1, wherein the step of demultiplexing includes the steps of:
providing a control signal with data from the data blocks to registers; and
dividing the data blocks in the registers into two groups and sending one group and the control signal to each encoder.

3. The method as recited in claim 2, wherein the step of demultiplexing includes the steps of:
providing a clock signal to synchronize the registers; and
sequencing the registers to provide a patterned data stream for transmitting the data blocks.

4. The method as recited in claim 1, wherein the step of encoding includes the step of encoding each data block by providing a pair of encoders.

5. The method as recited in claim 1, further comprising the step of:

transforming the uncoded data blocks from a 10 line uncoded input format at an input to a 12 line coded transmission at an output for transmitting the coded data blocks.

6. The method as recited in claim 1, further comprising the step of adjusting transmission delay by a dynamically adjustable delay in each transmission link.

7. The method as recited in claim 6, further comprising the step of retiming coded data blocks on each link with a dedicated adjustable clock.

8. The method as recited in claim 6, further comprising the step of eliminating skew among the links by providing a second retiming of data transferred on the links at a rate less than the predetermined baud rate with a clock system shared by all links.

9. The method as recited in claim 1, further comprising the step of:
receiving transmitted coded data blocks from the transmission lines at a receiver end.

10. The method as recited in claim 9, further comprising the step of checking disparity to determine errors in the data blocks at the receiver end.

11. The method as recited in claim 1, wherein the step of encoding further comprises the steps of:
outputting data blocks from each encoder to a disparity register; and
inputting disparity data from each disparity register to the encoder associated the disparity register to create a running disparity check of the data blocks.

12. The method as recited in claim 1, further comprising the steps of:
deserializing the serially transmitted coded data blocks at a receiver end to provide parallel coded data blocks;
decoding the data blocks at a deserialized rate, the deserialized rate being lower than the predetermined baud rate; and
multiplexing the decoded data blocks to provide parallel data blocks at the predetermined baud rate.

13. The method as recited in claim 1, wherein each uncoded data block includes 10 bits.

14. The method as recited in claim 1, wherein the predetermined baud rate is greater than or equal to about 2 Gbaud.

15. A system for coding parallel data for transmission while maintaining baud rate comprising:
a data input for inputting a plurality of data blocks having a predetermined baud rate;
a demultiplexer coupled to the data input for sequentially distributing the data blocks;
a plurality of encoders coupled to outputs of the demultiplexer for encoding the data blocks distributed by the demultiplexer at a demultiplexed rate, the demultiplexed rate being lower than the predetermined baud rate;
a plurality of serializers, each coupled to one of the encoders, for serializing coded data blocks output from the encoder at the predetermined baud rate, wherein the predetermined baud rate is maintained by providing an adequate number transmission links; and
disparity control means being coupled to each encoder for maintaining an average of equal numbers of coded bits with a value of one or zero.

16. The system as recited in claim 15, wherein the demultiplexer includes registers for dividing the data blocks in the registers into two groups and sending one group and a control signal to one of two encoders associated with each register.

17. The system as recited in claim 16, wherein the demultiplexer includes a clock for providing clock signals to synchronize the registers to provide a patterned data stream for transmitting the coded data blocks.

18. The system as recited in claim 15, wherein the encoders include 5B/6B encoders.

19. The system as recited in claim 15, further comprising a plurality of transmission links coupled to the serializers for transmitting serial data to a receiver.

20. The system as recited in claim 15, further comprising
a plurality of deserializers to deserialize the transmitted encoded data blocks at a receiver end;
a plurality decoders for decoding the data blocks at a deserialized rate which is lower than the predetermined baud rate; and
a multiplexer for sequencing the decoded data blocks to provide parallel data blocks at the predetermined baud rate.

21. The system as recited in claim 15, wherein a pair of coded data blocks are concentrated on a transmission link such that the data blocks generate a singular synchronizing comma sequence.

22. The system as recited in claim 15, further comprising a transmission delay adjusting device for sampling and retiming the coded data blocks on transmission lines.

23. The system as recited in claim 15, wherein the predetermined baud rate is greater than or equal to about 2 Gbaud.

24. The system as recited in claim 11, wherein the input data blocks include 10 bits.

25. A system for providing uniform data transmissions between electronic devices while maintaining baud rate comprising:
a data input for inputting a plurality of 10-bit data blocks having a predetermined baud rate;
a demultiplexer coupled to the data input for sequentially distributing the data blocks among outputs of the demultiplexer;
a pair of 5B/6B encoders coupled to each of the outputs of the demultiplexer for encoding the data blocks distributed by the demultiplexer at the predetermined baud rate;
a serializer coupled to each of the encoders, for serializing coded data blocks output from the encoder at the predetermined baud rate;
a transmission line coupled to each serializer for transferring data to a receiver;
disparity checking means for determining errors in the received data blocks, the disparity checking means including a register being coupled to each decoder; and
timing means for sequencing data blocks to the encoders in accordance with the predetermined baud rate.

26. The system as recited in claim 25, wherein the demultiplexer includes registers for dividing the data blocks in the registers into two groups and sending one group and a control signal to one of two encoders associated with each register.

27. The system as recited in claim 26, wherein the timing means includes a clock for providing clock signals to synchronize registers provided in the demultiplexer to provide a patterned data stream for transmitting the data blocks.

28. The system as recited in claim 25, further comprising
a deserializer coupled to each transmission line on a receiver end to deserialize serially transmitted encoded data blocks at the receiver end to provide parallel coded data blocks;

a decoder coupled to the deserializers for decoding the encoded data blocks at a rate lower than the predetermined baud rate; and a multiplexer for sequencing the data blocks to provide parallel data blocks at the predetermined baud rate.

29. The system as recited in claim 25, further comprising a transmission delay adjusting device for sampling and retiming transmission rates for the serially transmitted data on the transmission lines.

30. The system as recited in claim 25, wherein the predetermined baud rate is greater than or equal to about 2 Gbaud.

31. The system as recited in claim 25, wherein transmitted data blocks are conditioned by digital or analog preemphasis to reduce distortion.

32. A method of coding parallel data for transmission while maintaining baud rate comprising the steps of:

providing a plurality of uncoded data blocks having a predetermined baud rate;

demultiplexing the data blocks to sequentially distribute the data blocks to encoders;

encoding the data blocks at the demultiplexed rate by encoding each data block by providing a pair of encoders;

serializing the coded data blocks for serially transmitting data at the predetermined baud rate.

33. A method of coding parallel data for transmission while maintaining baud rate comprising the steps of:

providing a plurality of uncoded data blocks having a predetermined baud rate;

demultiplexing the data blocks to sequentially distribute the data blocks to encoders;

encoding the data blocks at the demultiplexed rate; and serializing the coded data blocks for serially transmitting data at the predetermined baud rate wherein the predetermined baud rate is greater than or equal to about 2 Gbaud.

* * * * *